(12) United States Patent
Hu et al.

(10) Patent No.: US 11,482,482 B2
(45) Date of Patent: Oct. 25, 2022

(54) SUBSTRATE STRUCTURES, METHODS FOR FORMING THE SAME AND SEMICONDUCTOR DEVICE STRUCTURES COMPRISING THE SAME

(71) Applicant: Advanced Semiconductor Engineering, Inc., Kaohsiung (TW)

(72) Inventors: Ian Hu, Kaohsiung (TW); Jin-Feng Yang, Kaohsiung (TW); Cheng-Yu Tsai, Kaohsiung (TW); Hung-Hsien Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/018,701

(22) Filed: Sep. 11, 2020

(65) Prior Publication Data

US 2022/0084926 A1     Mar. 17, 2022

(51) Int. Cl.
*H01L 23/498* (2006.01)
*H01L 23/427* (2006.01)
*H01L 21/48* (2006.01)
*H01L 23/00* (2006.01)

(52) U.S. Cl.
CPC ...... *H01L 23/49827* (2013.01); *H01L 21/486* (2013.01); *H01L 21/4878* (2013.01); *H01L 23/427* (2013.01); *H01L 24/16* (2013.01); *H01L 2224/16227* (2013.01)

(58) Field of Classification Search
CPC . H01L 23/49827; H01L 24/16; H01L 21/486; H01L 21/4878; H01L 23/427; H01L 2224/16227
See application file for complete search history.

(56) References Cited

U.S. PATENT DOCUMENTS

| | | | |
|---|---|---|---|
| 2007/0108599 A1 | 5/2007 | Im et al. | |
| 2015/0179617 A1* | 6/2015 | Lin | H01L 25/0652 257/713 |
| 2016/0095203 A1* | 3/2016 | Min | H05K 1/0204 361/690 |
| 2016/0133541 A1* | 5/2016 | Ozawa | H01L 23/4334 257/773 |
| 2018/0204784 A1* | 7/2018 | Kawase | H01L 25/18 |
| 2020/0365485 A1* | 11/2020 | Hu | H01L 25/0657 |

* cited by examiner

*Primary Examiner* — Ahmed N Sefer
(74) *Attorney, Agent, or Firm* — Foley & Lardner LLP

(57) ABSTRACT

A substrate structure, a method for manufacturing the same and a semiconductor device structure including the same are provided. The substrate structure includes a heat pipe, a first conductive layer and an insulation layer. The heat pipe has an upper surface and a lower surface. The heat pipe includes an opening extending from the upper surface to the lower surface. The first conductive layer is disposed on the upper surface and includes a via structure passing through the opening. The insulation layer is disposed between the heat pipe and the conductive layer.

9 Claims, 22 Drawing Sheets

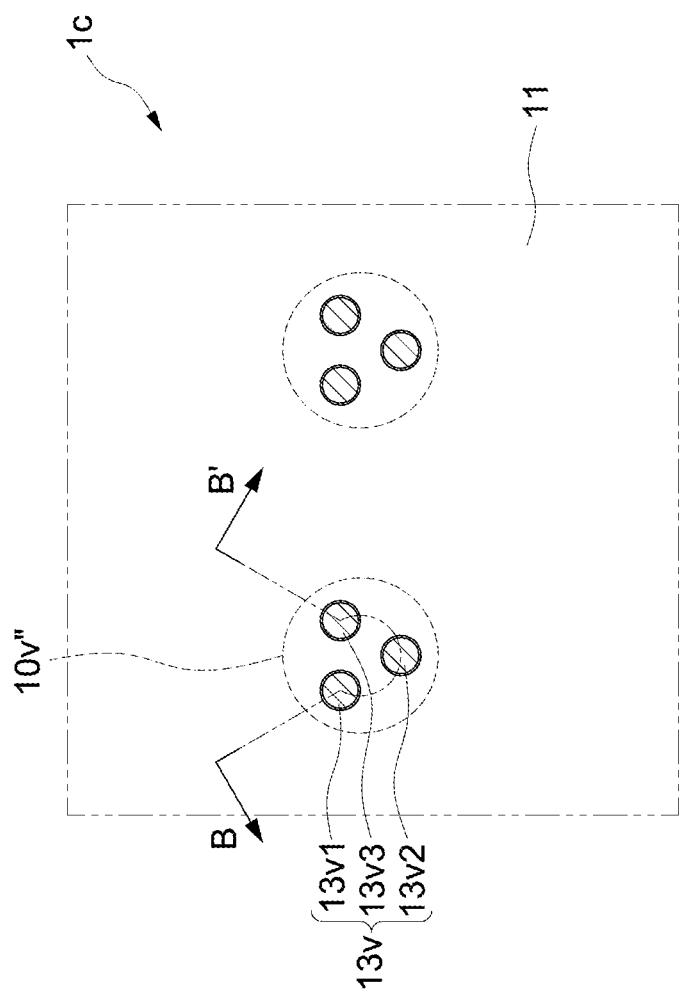

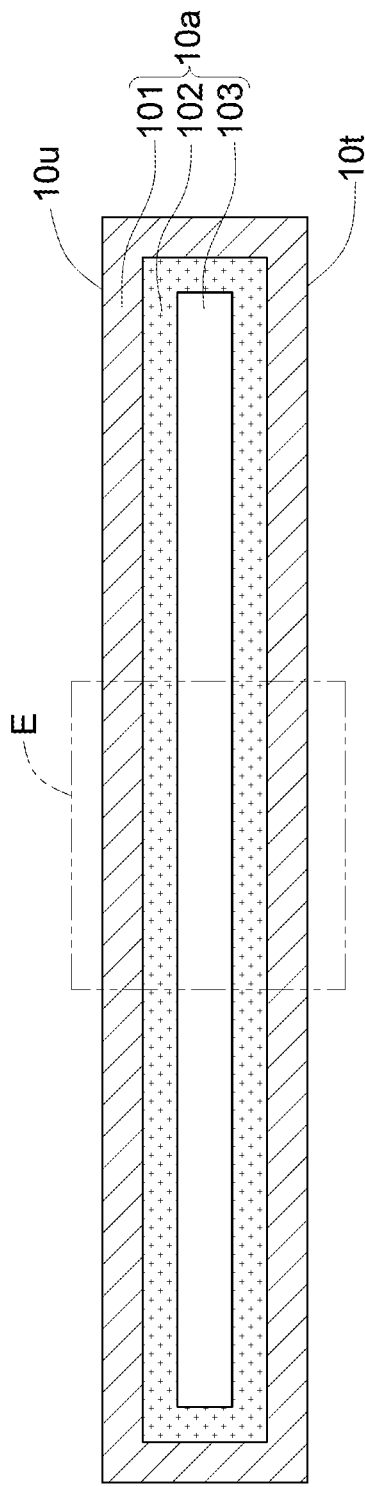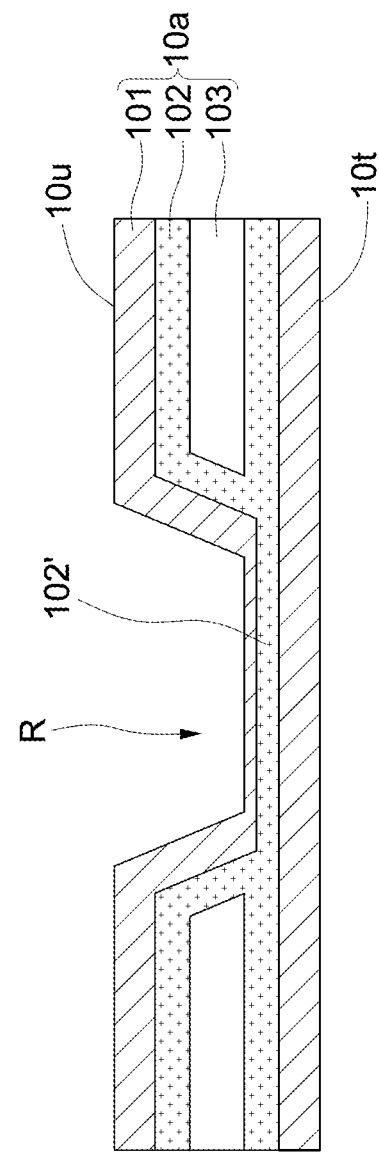

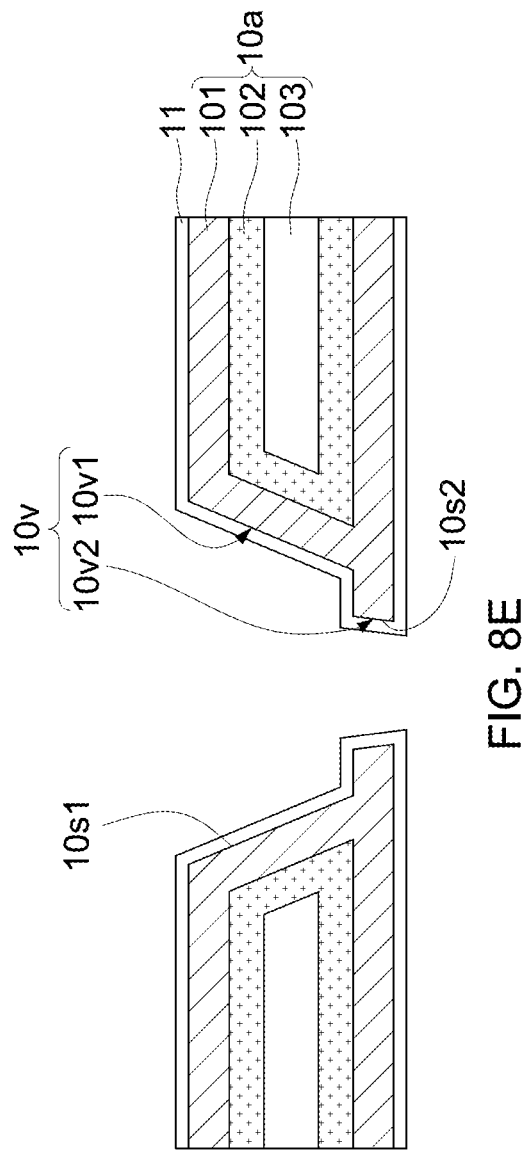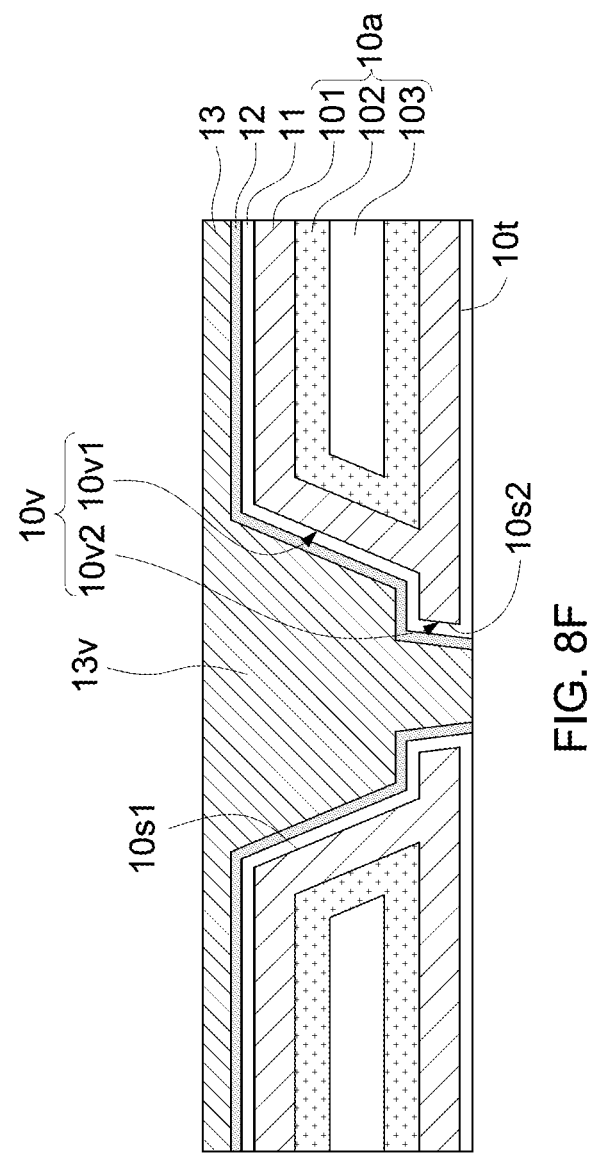

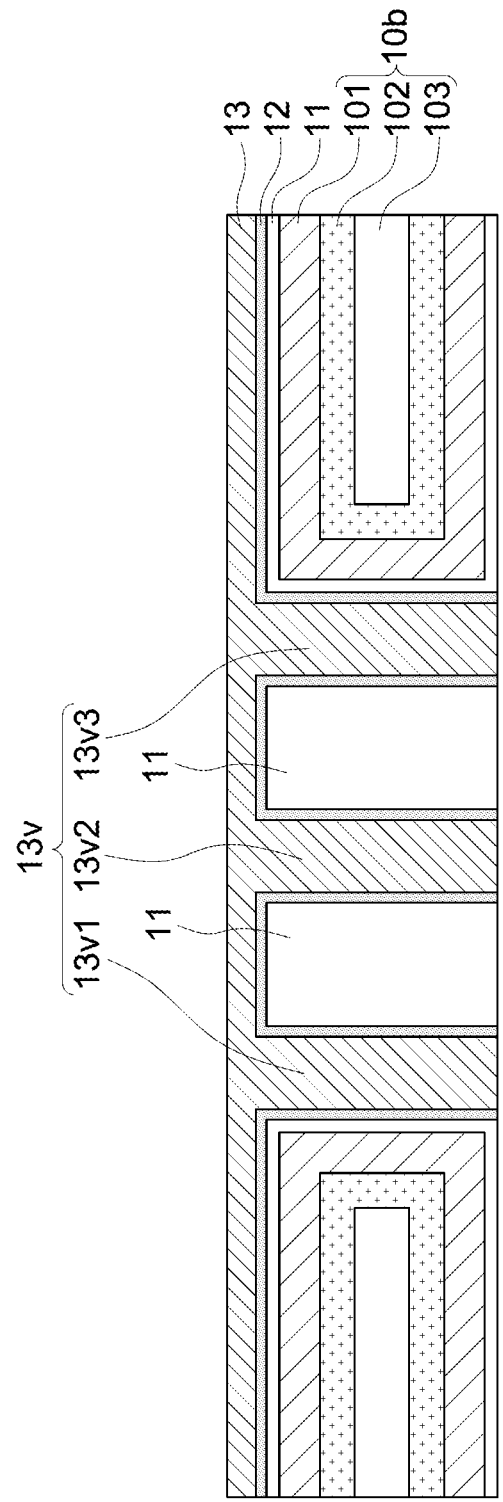

SUBSTRATE STRUCTURES, METHODS FOR FORMING THE SAME AND SEMICONDUCTOR DEVICE STRUCTURES COMPRISING THE SAME

BACKGROUND

1. Field of the Disclosure

The present disclosure relates to a substrate structure, and particularly to a substrate structure including a heat pipe with an opening. The present disclosure also relates to a method for manufacturing the substrate structure and a semiconductor device structure including the substrate structure.

2. Description of the Related Art

As semiconductor device structures develop, a substrate with higher thermal conductivity is needed. One of the approaches to enhance thermal conductivity is to embed a heat pipe in a substrate. However, the heat pipe occupies the space that is used to accommodate conductive traces, which decreases electrical conductivity of the substrate. Therefore, a new substrate structure is required to solve the aforementioned problem.

SUMMARY

In some embodiments, a substrate structure includes a heat pipe, a first conductive layer and an insulation layer. The heat pipe has an upper surface and a lower surface. The heat pipe includes an opening extending from the upper surface to the lower surface. The first conductive layer is disposed on the upper surface and includes a via structure passing through the opening. The insulation layer is disposed between the heat pipe and the conductive layer.

In some embodiments, a semiconductor device structure includes a heat pipe, a conductive layer and a first die. The heat pipe has an upper surface and a lower surface. The conductive layer is disposed on the upper surface of the heat pipe and separated from the heat pipe by an insulation layer. The first die is disposed above the upper surface of the heat pipe and electrically connected to the conductive layer. The first die overlaps the heat pipe.

In some embodiments, a method for manufacturing a substrate structure includes: providing a heat pipe having an upper surface and a lower surface; forming an opening penetrating from the upper surface to the lower surface of the heat pipe; and forming a conductive layer on the upper surface of the heat pipe and in the opening of the heat pipe.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

FIG. 3A illustrates a bottom view of an example of a substrate structure according to some embodiments of the present disclosure.

FIG. 8A, FIG. 8B, FIG. 8C, FIG. 8D, FIG. 8E, FIG. 8F and FIG. 8G illustrate various stages of an example of a method for manufacturing a substrate structure according to some embodiments of the present disclosure.

FIG. 9A, FIG. 9B, FIG. 9C, FIG. 9D and FIG. 9E illustrate various stages of an example of a method for manufacturing a substrate structure according to some embodiments of the present disclosure.

DETAILED DESCRIPTION

Figure 1A:
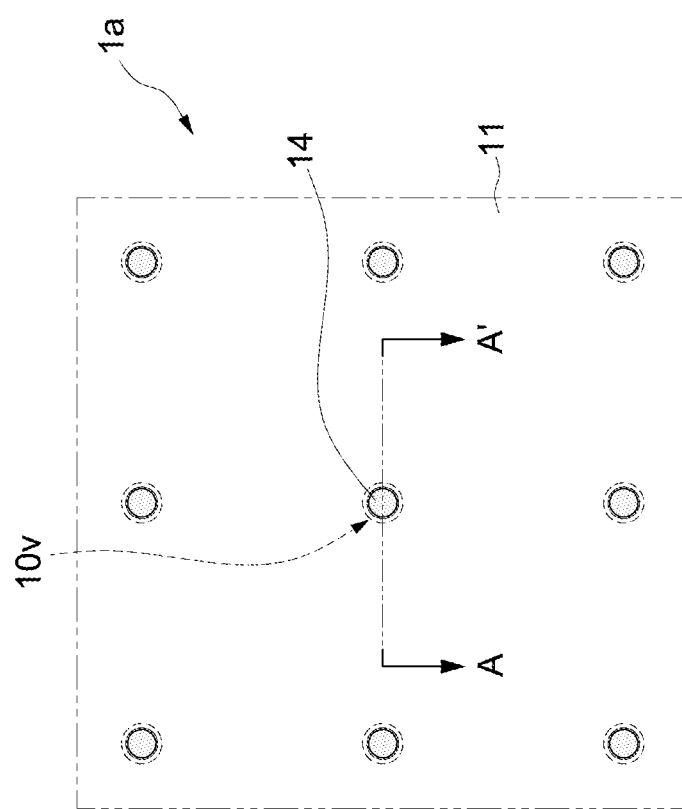
FIG. 1A illustrates a bottom view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
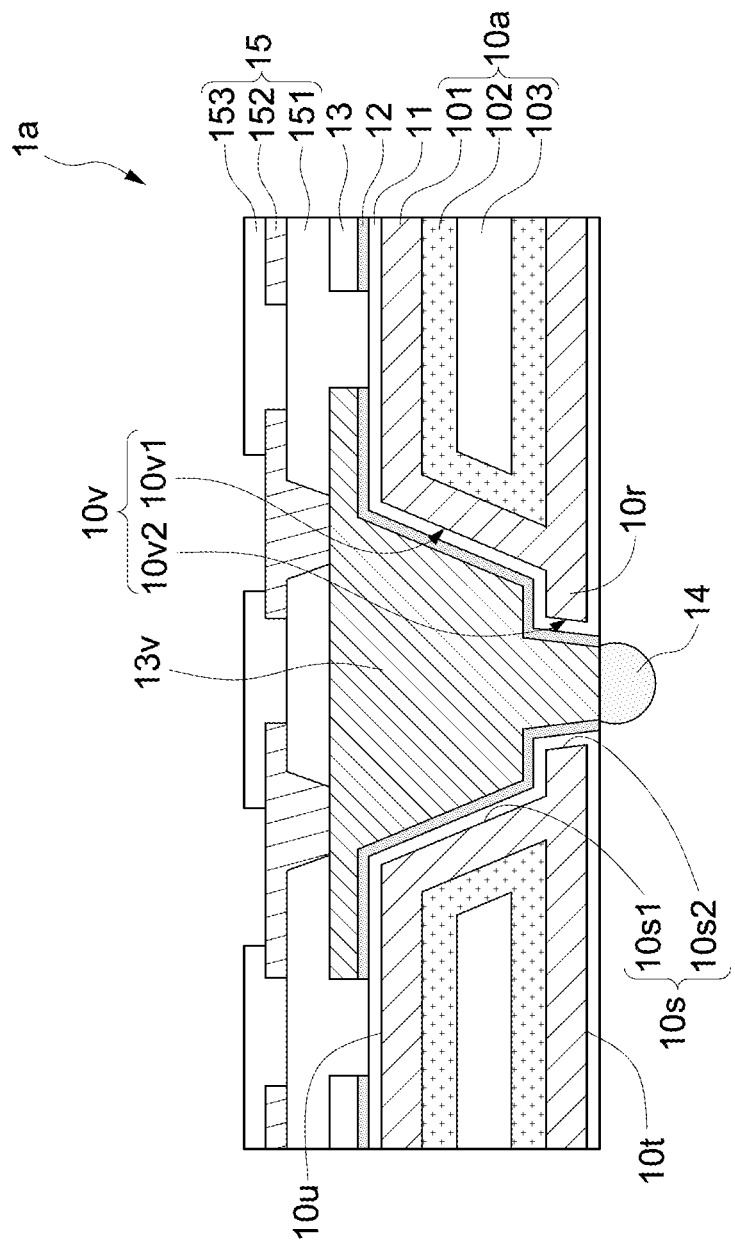
FIG. 1B illustrates a cross-sectional view of an example of the substrate structure along line A-A' of FIG. 1A.

FIG. 1A illustrates a bottom view of an example of a substrate structure 1a according to some embodiments of the present disclosure; FIG. 1B illustrates a cross-sectional view of the substrate structure 1a along line A-A' of FIG. 1A. In some embodiments, the substrate structure 1a may include a heat pipe 10*a*, an insulation layer 11, a conductive layer 13, a conductive element 14 and a redistribution layer 15.

The heat pipe 10*a* may define a plurality of openings 10*v*. As shown in FIG. 1A, the plurality of openings 10*v* may be arranged in, without limitation, a regular pattern or in an irregular pattern. Each of the openings 10*v* may correspond to one conductive element 14. That is, the conductive element 14 may overlap the opening 10*v* defined by the heat pipe 10*a*. The insulation layer 11 may cover the lower surface of the heat pipe 10*a*.

Referring to FIG. 1B, the heat pipe 10*a* may include a shell 101, a wick 102 and a cavity 103 (e.g., vapor cavity). The heat pipe 10*a* may transport heat from a high temperature region (e.g., an end adjacent to a via structure 13*v* of the conductive layer 13) to a low temperature region (e.g., an end distal to the via structure 13*v* of the conductive layer 13). Heat may be transported in a cycle. For example, a working fluid may evaporate by absorbing heat in the high temperature region, move toward the low temperature region along the cavity 103, condense back to a liquid phase by dissipating heat and is absorbed by the wick 102 in the low temperature region, and then move back to the high temperature region to continue another cycle.

The shell 101 may be an outmost layer of the heat pipe 10*a*. The shell 101 may include metal, such as copper (Cu), aluminum (Al), titanium (Ti), nickel (Ni), silver (Ag), alloy or other suitable materials.

The wick 102 may be disposed on an inner surface of the shell 101. The wick 102 may be sealed by the shell 101 and defines the cavity 103 together with the shell 101. The wick 102 may include, for example, a capillary structure, a porous structure, a fiber structure, a mesh structure or other suitable structures. The wick 102 may include metal, such as Cu, Al, Ti, Ni, Ag, alloy or other suitable materials. In some embodiments, the material of the wick 102 may be the same as or similar to that of the shell 101. In some embodiments, the wick 102 and the shell 101 include Cu.

The working fluid may include water, alcohol or other liquids that can undergo gas-liquid phase changes within the shell 101.

The heat pipe 10*a* may include an upper surface 10*u*, a lower surface 10*t*, and a sidewall 10*s*. The lower surface 10*t* may be opposite to the upper surface 10*u*. The sidewall 10*s* may extend from the upper surface 10*u* to the lower surface 10*t*. In some embodiments, the sidewall 10*s* may include a surface 10*s*1 and a surface 10*s*2 with different slants with respect to the normal direction of the upper surface 10*u*. The surface 10*s*1 may be adjacent to the upper surface 10*u*, and the surface 10*s*2 may be adjacent to the lower surface 10*t*.

Figure 1C:
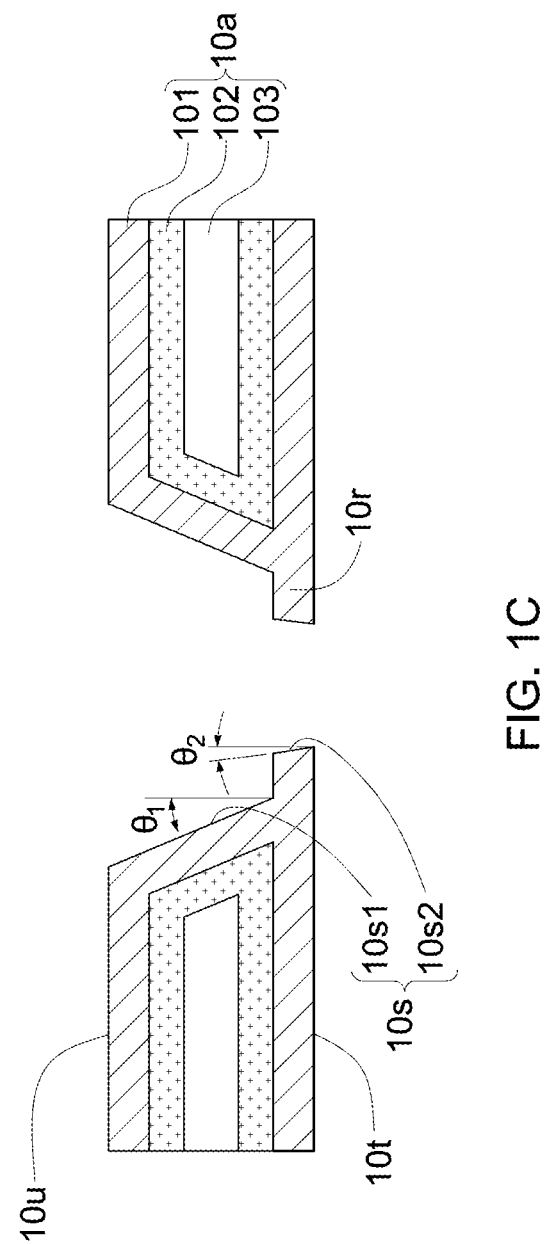
FIG. 1C illustrates a cross-sectional view of an example of the heat pipe along line A-A' of FIG. 1A.

In some embodiments, the heat pipe 10*a* includes the opening 10*v* penetrating from the upper surface 10*u* to the lower surface 10*t*. The sidewall 10*s* of the heat pipe 10*a* defines the opening 10*v*. In some embodiments, the opening 10*v* may include a portion 10*v*1 and a portion 10*v*2 with different taper angles. In some embodiments, the portion 10*v*2 of the opening 10*v* is defined by the surface 10*s*2 of the sidewall 10*s*. The taper angle of the opening is defined as an angle constituted by the sidewall of the heat pipe and the normal direction of the upper surface of the heat pipe. FIG. 1C illustrates a cross-sectional view of an example of the heat pipe 10*a* along line A-A' of FIG. 1A. As shown in FIG. 1C, the portion 10*v*1 may have a taper angle $\theta_1$ which is constituted by the surface 10*s*1 and the normal direction of the upper surface 10*u*; the portion 10*v*2 may have a taper angle $\theta_2$ which is constituted by the surface 10*s*2 and the normal direction of the upper surface 10*u*. In some embodiments, the taper angle $\theta_1$ is greater than the taper angle $\theta_2$.

In some embodiments, the heat pipe 10*a* may include a portion 10*r* protruding from the sidewall 10*s* of the heat pipe 10*a*. In some embodiments, the protruding portion 10*r* may be adjacent to the lower surface 10*t* of the heat pipe 10*a* or distal to the upper surface 10*u* of the heat pipe 10*a*. In some embodiments, the protruding portion 10*r* is defined by the surface 10*s*2, the lower surface 10*t* and a surface connecting the surfaces 10*s*1 and 10*s*2. In some embodiments, the opening 10*v* may have a greater aperture at the upper surface 10*u* and a smaller aperture at the lower surface 10*t*.

In some embodiments, the insulation layer 11 may be disposed on the heat pipe 10*a*. In some embodiments, the insulation layer 11 may be disposed on the upper surface 10*u* of the heat pipe 10*a*. In some embodiments, the insulation layer 11 may be disposed on the sidewall 10*s* of the heat pipe 10*a*. In some embodiments, the insulation layer 11 may be disposed on the lower surface 10*t* of the heat pipe 10*a*. In some embodiments, the insulation layer 11 is disposed between the heat pipe 10*a* and the conductive layer 13. In some embodiments, the insulation layer 11 may seal the heat pipe 10*a*. The insulation layer 11 may cover the upper surface 10*u*, sidewall 10*s* and lower surface 10*t* of the heat pipe 10*a*. Although FIG. 1B illustrates that the insulation layer 11 completely seals the heat pipe 10*a*, the insulation layer 11 may include some openings exposing the heat pipe 10*a* in some other embodiments. The insulation layer 11 may include oxide, nitride, polymer or other suitable materials.

The substrate structure 1*a* may further include a seed layer 12. In some embodiments, the seed layer 12 may be disposed on the insulation layer 11 so as to facilitate the formation of the conductive layer 13. The seed layer 12 may be viewed as a portion of the conductive layer 13. In some embodiments, the seed layer 12 may be disposed on the upper surface 10*u* of the heat pipe 10*a*. In some embodiments, the seed layer 12 may be disposed on the sidewall 10*s* of the heat pipe 10*a*. The seed layer 12 may be conformally disposed on the surface 10*s*1, the protruding portion 10*r* and the surface 10*s*2. In some embodiments, the seed layer 12 is not formed on the lower surface 10*t* of the heat pipe 10*a*. The seed layer 12 may have a surface coplanar with a lower surface of the insulation layer 11. The seed layer 12 may be patterned so that a portion of the insulation layer 11 is exposed from the seed layer 12. The seed layer 12 may include metal, such as Cu, Al, Ti, Ni or Ag, alloy, or other suitable materials.

The conductive layer 13 may include traces, vias and pads. In some embodiments, the conductive layer 13 may be disposed on the seed layer 12. In some embodiments, the conductive layer 13 may be disposed on the upper surface 10*u* and the sidewall 10*s* of the heat pipe 10*a*. In some embodiments, the conductive layer 13 may include a via structure 13*v* filling the opening 10*v*. In some embodiments, the via structure 13*v* penetrates the heat pipe 10*a*, e.g., by passing through the opening 10*v*. In some embodiments, the via structure 13*v* may be tapered from the upper surface 10*u* to the lower surface 10*t* of the heat pipe 10*a*. Further, the via structure 13*v* may be tapered with different taper angles corresponding to the portions 10*v*1 and 10*v*2.

In some embodiments, the conductive layer 13 may define multiple openings exposing the insulation layer 11. In some embodiments, the conductive layer 13 may be separated from the heat pipe 10*a* by the insulation layer 11. In some embodiments, the conductive layer 13 may be completely separated from the heat pipe 10*a*. In some other embodiments, the insulation layer 11 may include openings (not shown) exposing the heat pipe 10*a*, and the conductive layer 13 (and/or the seed layer 12) may be in contact with the shell 101 of the heat pipe 10a through the openings defined by the insulation layer 11 to provide additional path for heat dissipation. In some embodiments, the conductive layer 13 may have a surface that is substantially coplanar with a lower surface of the insulation layer 11. The conductive layer 13 may include metal, such as Cu, Al, Ti, Ni or Ag, alloy or other suitable materials.

Although FIG. 1B illustrates that no conductive layer is formed on the lower surface 10t of the heat pipe 10a, an additional conductive layer may be disposed on the lower surface 10t of the heat pipe 10a according to some other embodiments. In this embodiment, the additional conductive layer may be electrically isolated from the conductive layer 13.

In some embodiments, the conductive element 14 may be disposed on the lower surface 10t of the heat pipe 10a. In some embodiments, the conductive element 14 may be electrically connected to the conductive layer 13. In some embodiments, the conductive element 14 may be in contact with the conductive layer 13. In some embodiments, the conductive element 14 may be electrically connected to the via structure 13v of the conductive layer 13 or in contact with the via structure 13v of the conductive layer 13. In some embodiments, the conductive element 14 may vertically overlap the opening 10v of the heat pipe 10a. The conductive element 14 may include, for example, a solder ball.

The redistribution layer 15 may be disposed on the upper surface 10u of the heat pipe 10a. The redistribution layer 15 may include a dielectric layer 151, a conductive layer 152 and a dielectric layer 153 to form electrical interconnection. The dielectric layer 151 may cover a portion of the conductive layer 13. The dielectric layer 151 may fill the openings defined by the conductive layer 13. The conductive layer 152 may be electrically connected to the conductive layer 13. The dielectric layer 153 may cover a portion of the conductive layer 152. The dielectric layer 153 may be patterned so that a portion of the conductive layer 152 may be exposed from the dielectric layer 153.

In the substrate structure according to the present disclosure, the heat pipe serves as a substrate and the conductive layer having a via structure penetrating the heat pipe is provided for electrical connection to an electronic component (e.g., a die) so the heat dissipation surface area is increased and the heat dissipation path is reduced. Heat generated from the electronic component can be quickly released to the external environment. The substrate structure according to the present disclosure integrates the functions of heat dissipation and electrical interconnection within a heat pipe; therefore, as compared to the comparative embodiments where an additional substrate is used, the substrate structure according to the present disclosure exhibits a superior heat dissipation ability while maintaining a sufficient amount of pathways for transporting electrical signals. Further, the substrate structure according to the present disclosure has a relatively small size as compared to the comparative embodiments.

Figure 2:
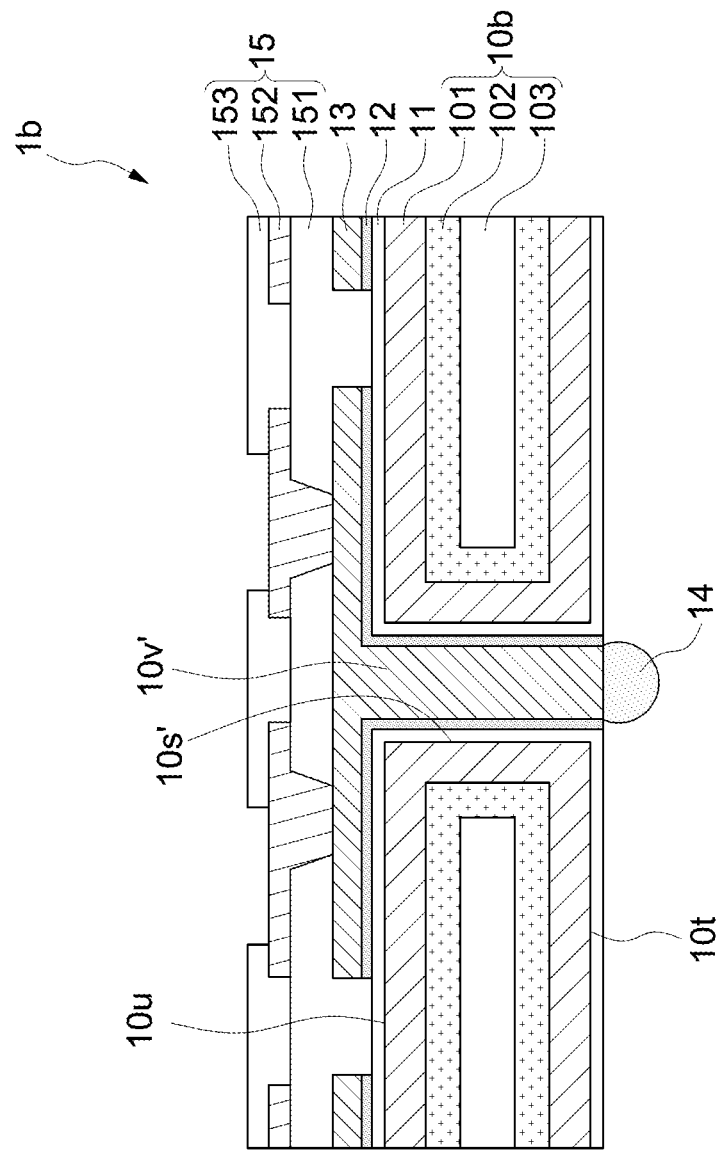
FIG. 2 illustrates a cross-sectional view of an example of a substrate structure according to some embodiments of the present disclosure.

FIG. 2 illustrates a cross-sectional view of an example of a substrate structure 1b according to some embodiments of the present disclosure. The substrate structure 1b of FIG. 2 has a structure similar to that of the substrate structure 1a of FIG. 1B, except that the heat pipe 10a is replaced by the heat pipe 10b.

The configuration of the opening 10v' of the heat pipe 10b is different from that of the opening 10v of the heat pipe 10a. Unlike the heat pipe 10a, the opening 10v' of the heat pipe 10b does not include the portions with different taper angles). The heat pipe 10b has a sidewall 10s' defining the opening 10v'. In some embodiments, the sidewall 10s' may be slant with respect to the normal direction of the upper surface 10u. In some embodiments, the opening 10v' defined by the heat pipe 10b may include a tapered profile. The opening 10v' may have an aperture at the upper surface 10u, which is greater than an aperture at the lower surface 10t. In some other embodiments, the sidewall 10s' may be substantially perpendicular to the upper surface 10u and the lower surface 10t. In some embodiments, the opening 10v' defined by the heat pipe 10b may include a non-tapered profile. The opening 10v' may have an aperture at the upper surface 10u, which is the same as an aperture at the lower surface 10t.

FIG. 3A illustrates a bottom view of an example of a substrate structure 1c according to some embodiments of the present disclosure. In some embodiments, the via structure 13v may include a plurality of vias (e.g., 13v1, 13v2 and 13v3) disposed with the opening 10v''. Each of the vias 13v1, 13v2 and 13v3 may be separated from each other, e.g., by the insulation layer 11. In some embodiments, the insulation layer 11 may fill the opening 10v''.

Figure 3B:
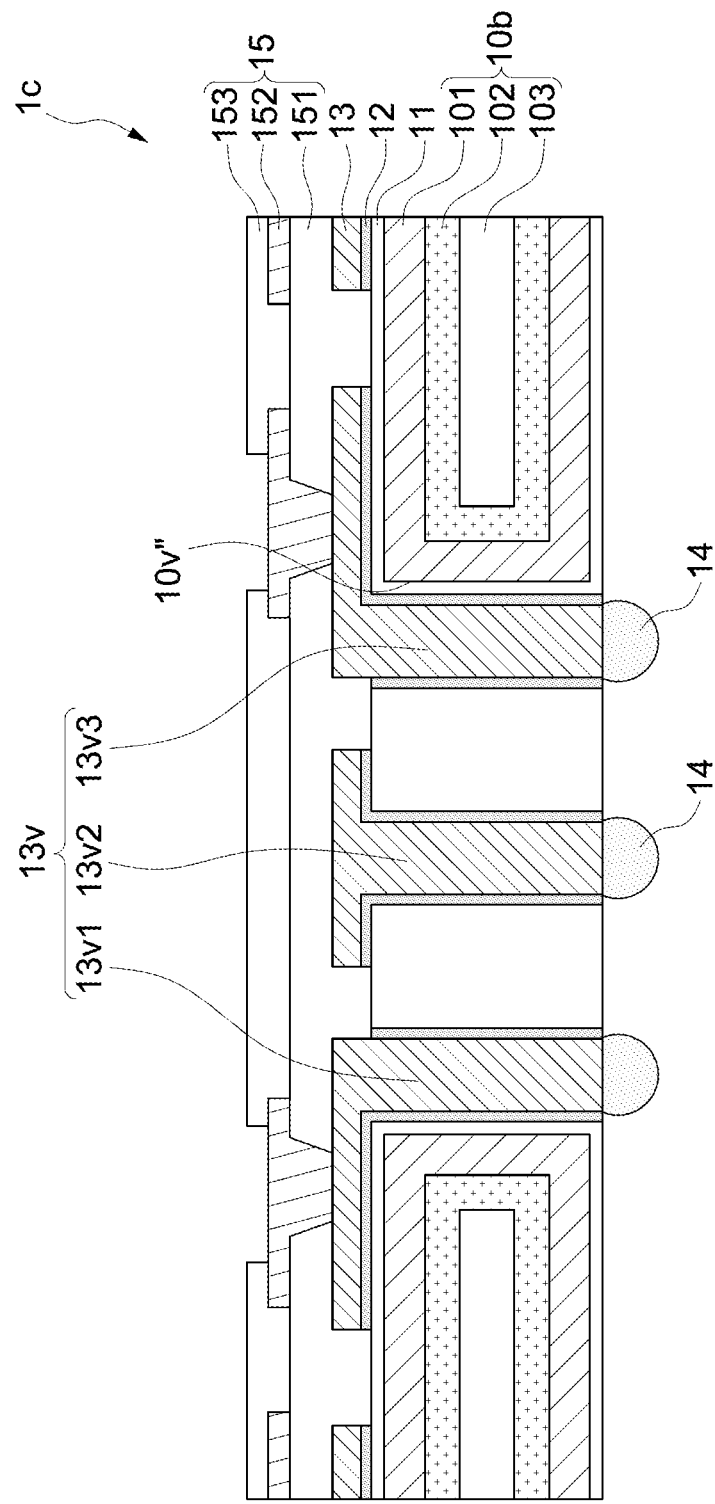
FIG. 3B illustrates a cross-sectional view of an example of the substrate structure along line B-B' of FIG. 3A.

FIG. 3B illustrates a cross-sectional view of an example of the substrate structure 1c along line B-B' of FIG. 3A. As shown in FIG. 3B, each of the vias 13v1, 13v2 and 13v3 may correspond to one conductive element 14. In this embodiment, a plurality of vias may be disposed within one opening 10v'' and electrically connected to a respective connection element 14. In some other embodiments, two or more of the vias disposed within one opening 10v'' may be connected to the same connection elements 14. Furthermore, the vias 13v1, 13v2 and 13v3 may be connected to trace(s) of the conductive layer 13. In some embodiments, the via 13v1, 13v2 and 13v3 may be connected to different trace(s) of the conductive layer 13.

Figure 4A:
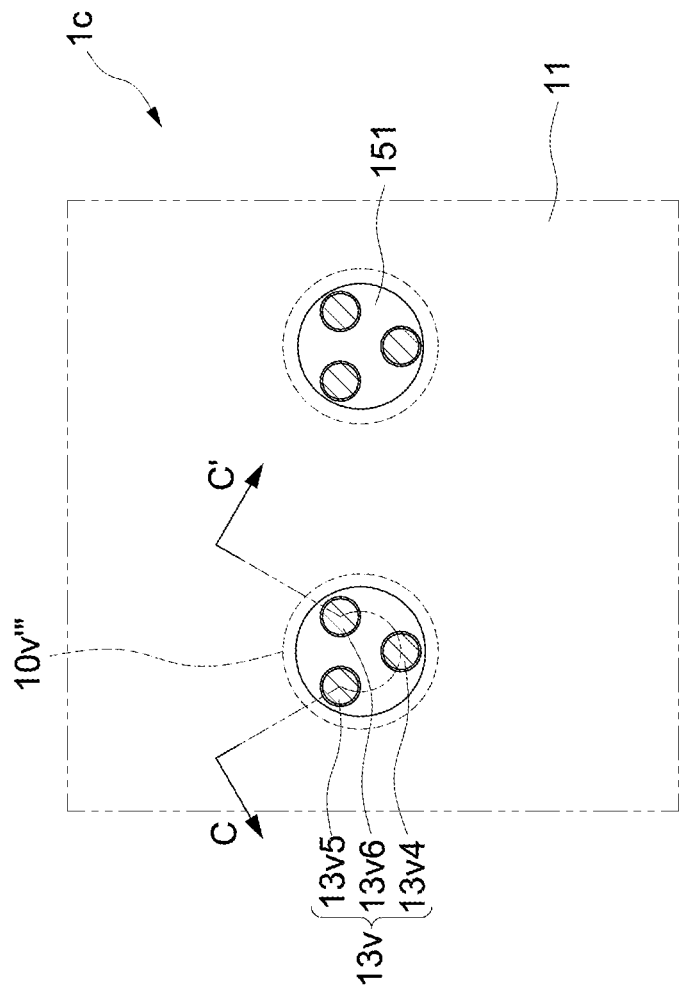
FIG. 4A illustrates a bottom view of an example of a substrate structure according to some embodiments of the present disclosure.

FIG. 4A illustrates a bottom view of an example of a substrate structure 1d according to some embodiments of the present disclosure. The via structure 13v may include a plurality of vias (e.g., 13v4, 13v5 and 13v6) disposed within the opening 10v''' of the heat pipe 10a.

Figure 4B:
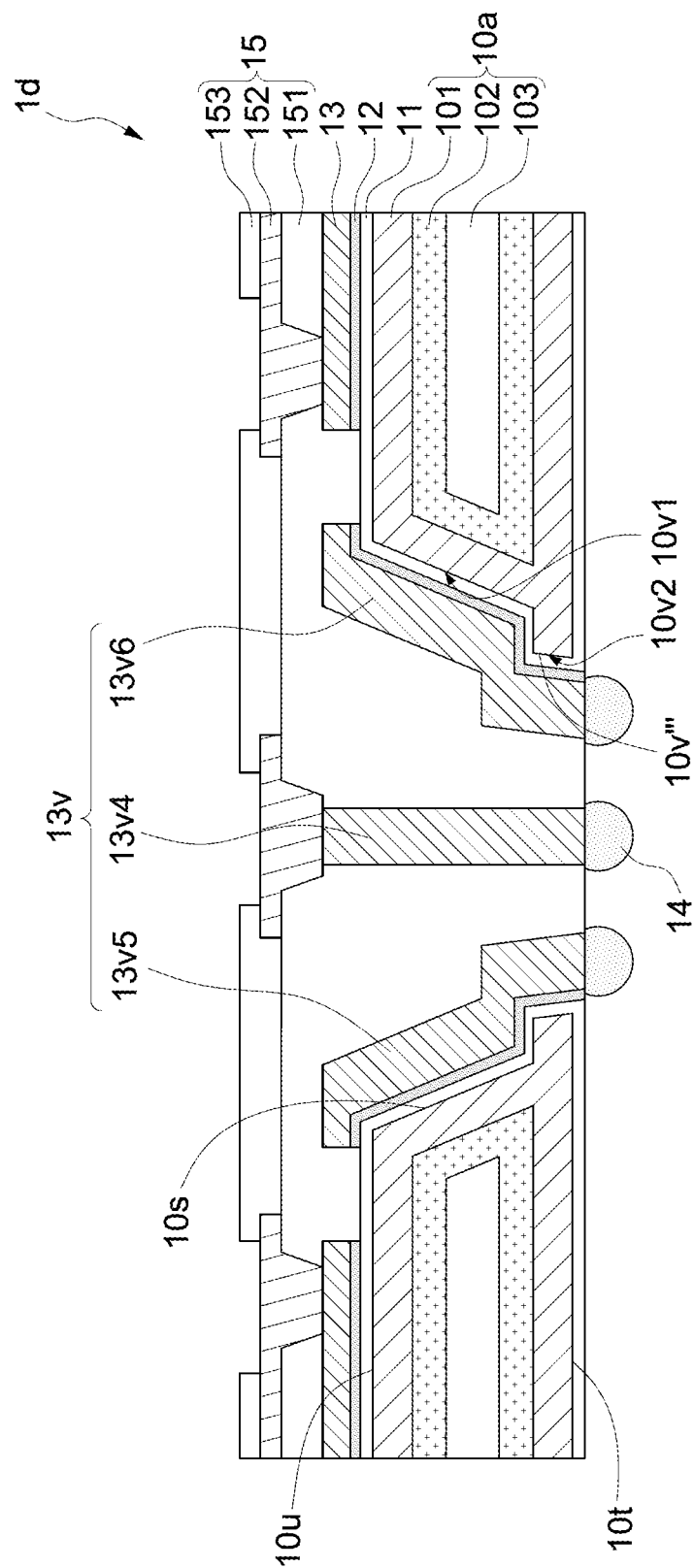
FIG. 4B illustrates a cross-sectional view of an example of the substrate structure along line C-C' of FIG. 4A.

FIG. 4B illustrates a cross-sectional view of an example of the substrate structure 1d along line C-C' of FIG. 4A. As shown in FIG. 4B, the vias 13v4, via 13v5 and via 13v6 are separated from each other by the dielectric layer 151. Each of the vias 13v4, 13v5 and 13v6 may extend from an upper surface 10u of 10a, along the portion 10v1 to the portion 10v2 of the opening 10v''', to a lower surface 10t of the heat pipe 10a. The vias 13v4, 13v5 and 13v6 may be disposed on the sidewall 10s of the heat pipe 10a. Each of the vias 13v4, 13v5, 13v6 may be conformally disposed on the sidewall 10s of the heat pipe 10a and have a substantially uniform thickness extending from the upper surface 10u to the lower surface 10t of the heat pipe 10a.

Figure 5:
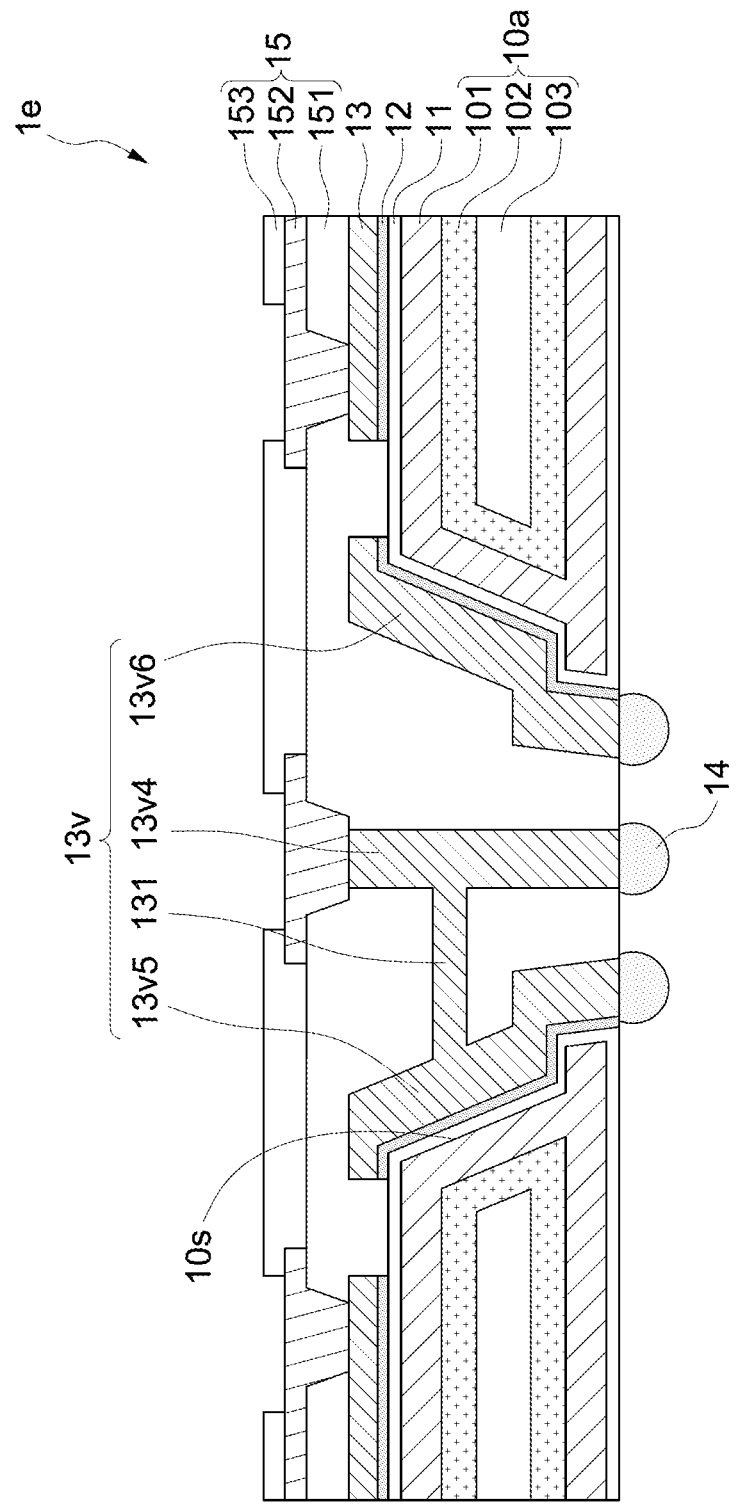
FIG. 5 illustrates a cross-sectional view of an example of a substrate structure according to some embodiments of the present disclosure.

FIG. 5 illustrates a cross-sectional view of an example of a substrate structure 1e according to some embodiments of the present disclosure. The substrate structure 1e of FIG. 5 has a structure similar to that of the substrate structure 1d of FIG. 4A, except that the via structure 13v of FIG. 5 further includes a connection structure 131. In some embodiments, two vias, such as via 13v4 and via 13v5, may be connected to each other by the connection structure 131 such that the via 13v4 may be electrically connected to the via 13v5. The connection structure 131 may be disposed within the opening 10v''' of the heat pipe 10a. The connection structure 131 may be disposed within the opening 10v''' along the sidewall 10s of the heat pipe 10a. In some embodiments, the connection structure 131 may have a curved profile from a top view. The connection structure 131 may be formed between the upper surface 10u and the lower surface 10t of the heat pipe 10a.

Figure 6:
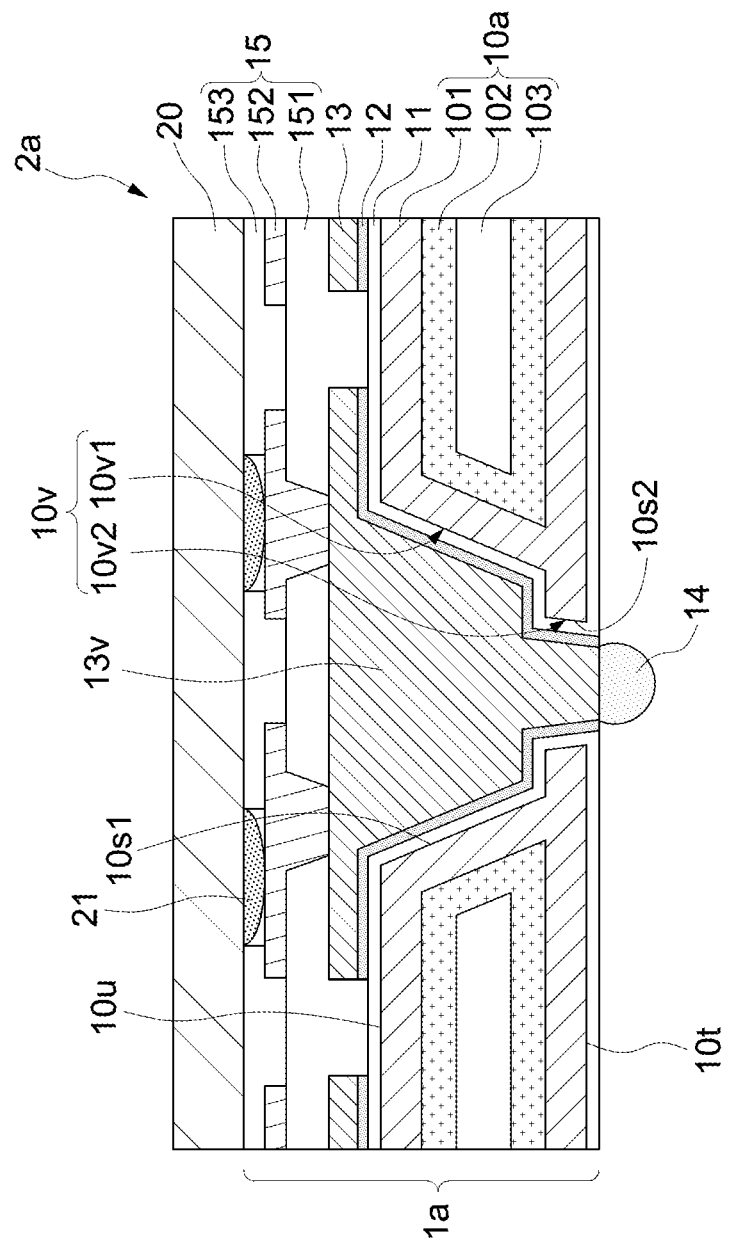
FIG. 6 illustrates a cross-sectional view of an example of a semiconductor device structure according to some embodiments of the present disclosure.

FIG. 6 illustrates a cross-sectional view of an example of a semiconductor device structure 2a according to some embodiments of the present disclosure. The semiconductor device structure 2a may include a die 20 disposed on the substrate structure 1a. The die 20 is disposed above the heat pipe 10. In some embodiments, the die 20 may overlap the heat pipe 10a or disposed directly above the heat pipe 10a. In some embodiments, the die 20 may overlap the openings 10v defined by the heat pipe 10a.

The die 20 may be disposed on the upper surface 10u of the heat pipe 10a. The die 20 may be electrically connected to the conductive element 14 through the bumps or balls 21 disposed below the die 20, the redistribution layer 15 and the via structure 13v of the conductive layer 13. As shown in FIG. 6, the die 20 may vertically overlap the opening 10v of the heat pipe 10a.

The substrate structure 1a may assist in dissipating heat generated from the die 20. Further, the conductive layer 13 covers the upper surface 10u of the heat pipe 10a and fills the opening 10v, and it can provide a larger surface area in contact with the heat pipe 10a. Therefore, heat may be efficiently transported from the die 20 to the heat pipe 10a through the conductive layer 13. For example, according to simulation data, the maximum temperature of the semiconductor device structure 2a during operation can be reduced from about 143° C. to about 119° C. in comparison with a traditional semiconductor device structure, which uses a heat pipe in combination with a metal substrate.

Figure 7:
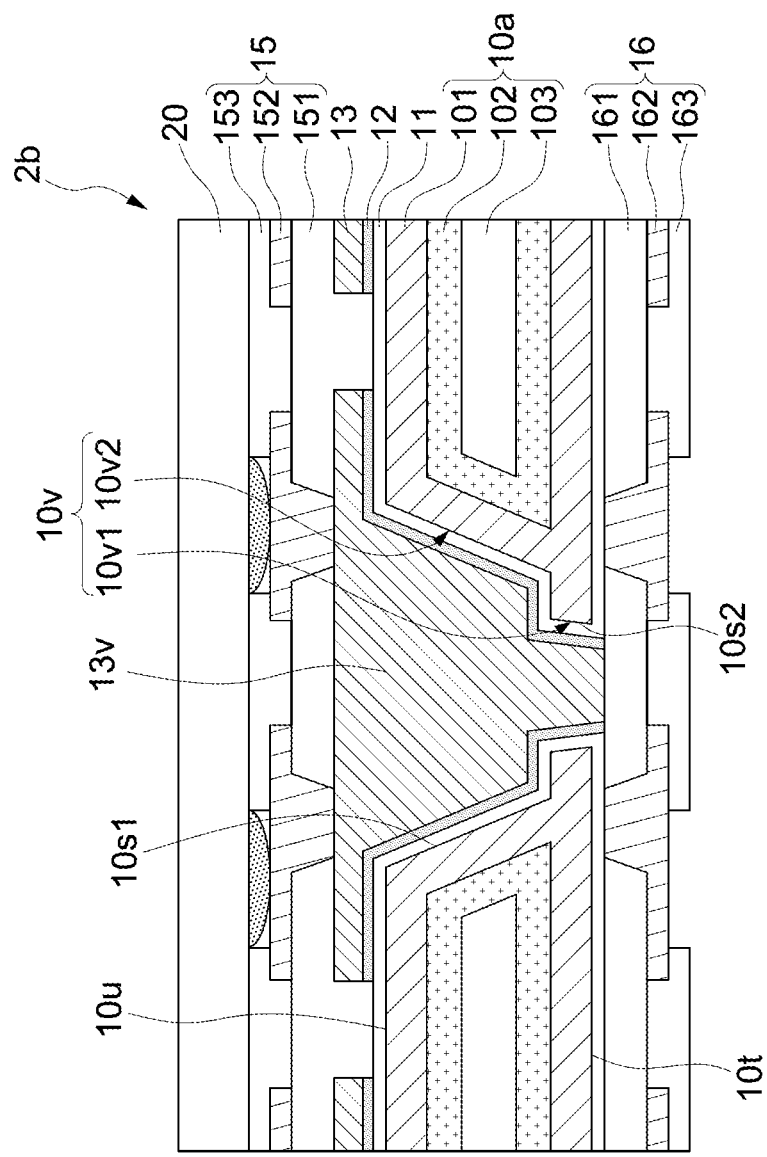
FIG. 7 illustrates a cross-sectional view of an example of a semiconductor device structure according to some embodiments of the present disclosure.

FIG. 7 illustrates a cross-sectional view of an example of a semiconductor device structure 2b according to some embodiments of the present disclosure. The semiconductor device structure 2b of FIG. 7 may have a structure similar to that of the substrate structure 2a of FIG. 6B, except that the semiconductor device structure 2b may have a redistribution layer 16 disposed on the lower surface 10t of the heat pipe 10a. The redistribution layer 16 may have a dielectric layer 161, a conductive layer 162 and a dielectric layer 163 that may be the same as or similar to the dielectric layer 151, conductive layer 152 and dielectric layer 153, respectively. In some embodiments, an additional electronic component (not shown), such as a die, may be disposed on the redistribution layer 16.

FIG. 8A, FIG. 8B, FIG. 8C, FIG. 8D, FIG. 8E, FIG. 8F and FIG. 8G illustrate various stages of an example of a method for manufacturing a substrate structure 1a according to some embodiments of the present disclosure.

Referring to FIG. 8A, a heat pipe 10a is provided. The heat pipe 10a includes a shell 101, a wick 102 and a cavity 103 sealed by the shell 101. The heat pipe 10a has an upper surface 10u and a lower surface 10t.

Figure 8C:
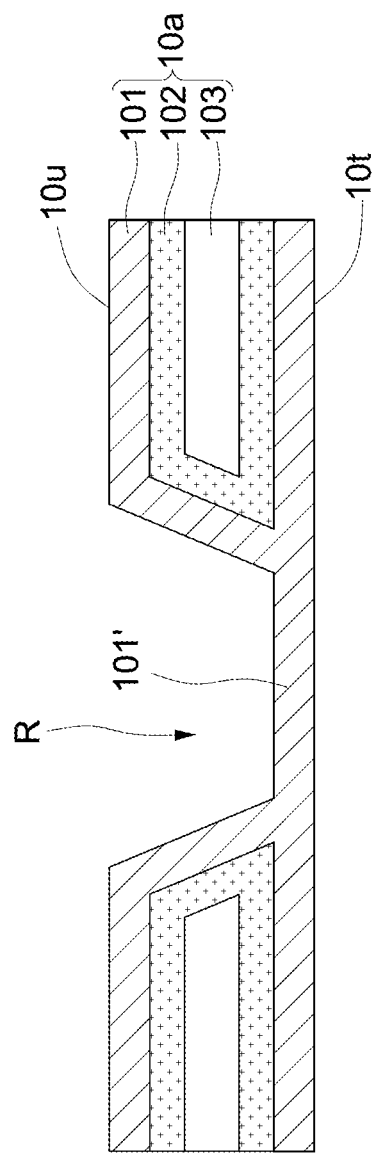

FIG. 8B, FIG. 8C, FIG. 8D, FIG. 8E, FIG. 8F and FIG. 8G are enlarged views of the section E of FIG. 8A, which illustrate cross-sectional views along line A-A' shown in FIG. 1A.

Referring to FIG. 8B, a recess R is formed. In some embodiments, a stamping process is performed on the upper surface 10u of the heat pipe 10a so that the recess R is recessed from the upper surface 10u of the heat pipe 10a. After stamping the heat pipe 10a, a portion of the wick 102 is compressed to form a wick 102' corresponding to where the recess R is formed.

Referring to FIG. 8C, a shell 101' is formed. In some embodiments, a sintering process is performed on the wick 102' to form the shell 101'. More specifically, the heat pipe 10a located at the bottom of the recess R is sintered to form the shell 101'. In some embodiments, the sintering process may include laser sintering or other suitable processes.

Figure 8D:
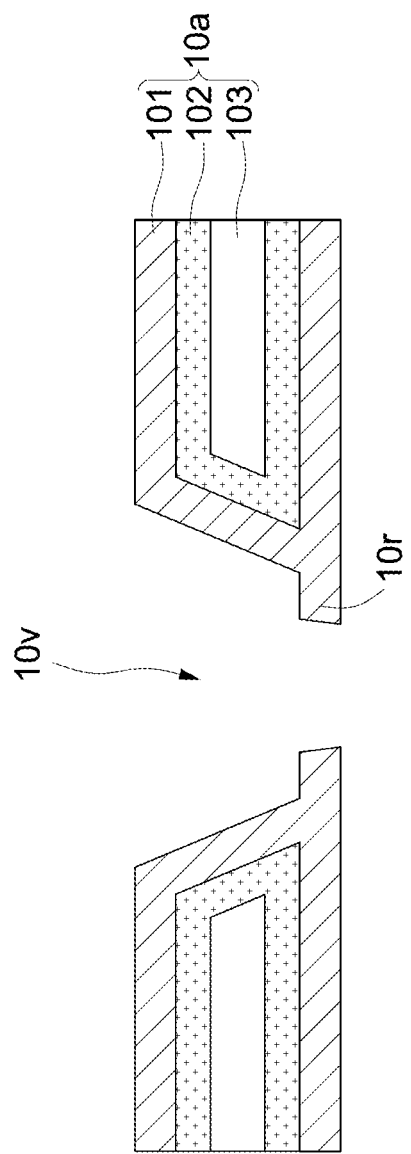

Referring to FIG. 8D, an opening 10v is formed. In some embodiments, a drilling process is performed on the shell 101' to form the opening 10v. In some embodiments, the portion of the shell 101' is drilled and portion of the shell 101' that is not drilled may form a protruding portion 10r.

Referring to FIG. 8E, an insulation layer 11 is formed. The insulation layer 11 may be formed by, without limitation, a spin-coating process or other suitable processes. The insulation layer 11 may cover the outer surface (e.g., the outer surface of the shell 101) of the heat pipe 10a.

Referring to FIG. 8F, a seed layer 12 and a conductive layer 13 are formed. In some embodiments, a carrier (not shown) is provided on which the lower surface 10t of the heat pipe 10a is disposed. Next, the seed layer 12 is formed on the insulation layer 11, and then the conductive layer 13 is formed on the seed layer 12. After the conductive layer 13 is formed, the carrier is removed. As a result, the conductive layer 13 is formed on the upper surface 10u and the sidewall 10s of the heat pipe 10a, but is not formed on the lower surface 10t of the heat pipe 10a. The seed layer 12 may be formed by, for example, a sputtering process. The conductive layer 13 may be formed by, for example, a plating process. In other embodiments, after the conductive layer 13 is formed, an additional carrier may be provided, and the conductive layer 13 is disposed on the additional carrier; next, an additional seed layer may be sputtered on the lower surface 10t of the heat pipe 10a, and an additional conductive layer may be formed on the lower surface 10t of the heat pipe 10a.

Figure 8G:
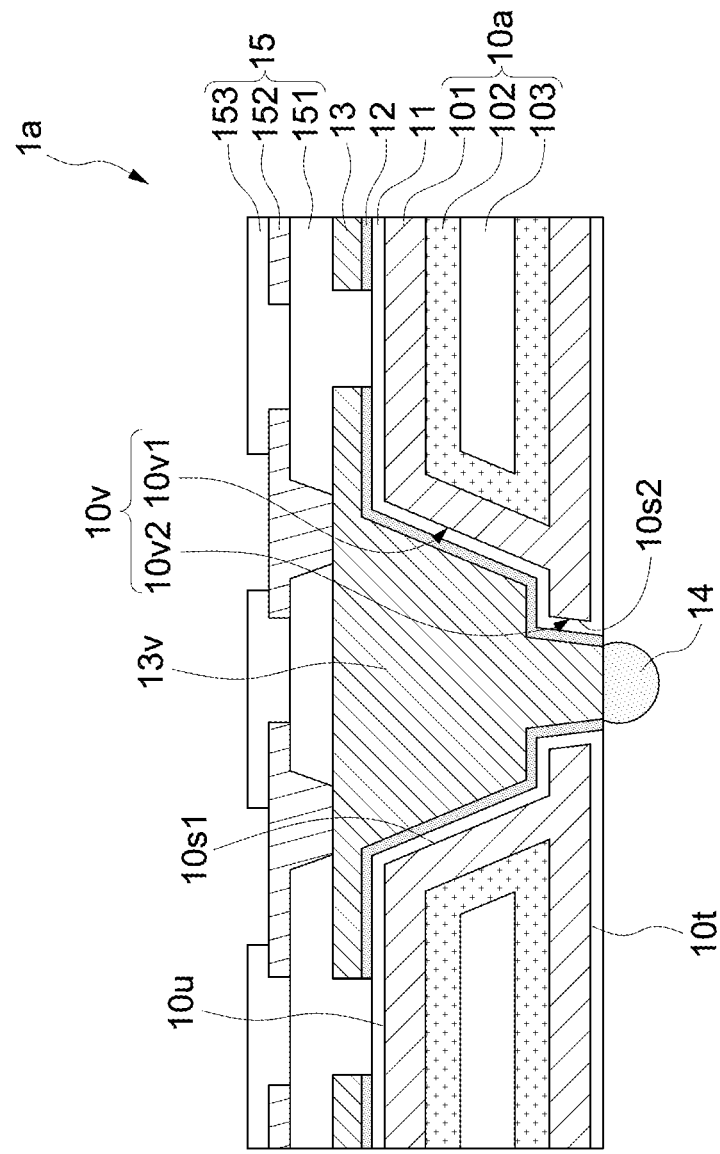

Referring to FIG. 8G, a conductive element 14 and a redistribution layer 15 are formed. In some embodiments, the seed layer 12 and the conductive layer 13 are patterned, and the redistribution layer 15 is formed on the conductive layer 13. The conductive element 14 is formed on the lower surface 10t of the heat pipe 10a and vertically overlaps the opening 10v of the heat pipe 10a. As a result, the substrate structure 1a is produced.

FIG. 9A, FIG. 9B, FIG. 9C, FIG. 9D and FIG. 9E illustrate various stages of an example of a method for manufacturing a substrate structure 1c according to some embodiments of the present disclosure. Further, FIG. 9A, FIG. 9B, FIG. 9C, FIG. 9D and FIG. 9E illustrate cross-sectional views along line B-B' shown in FIG. 3A.

Figure 9A:
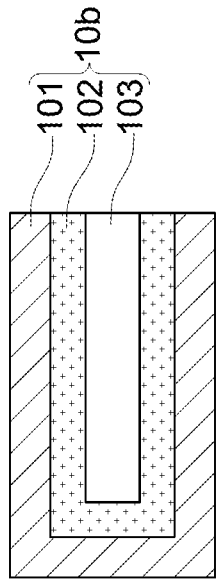
Figure 9A:
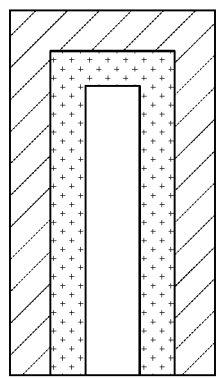

Referring to FIG. 9A, a heat pipe 10b is provided, and an opening 10v'' is formed to penetrate the heat pipe 10b.

Figure 9B:
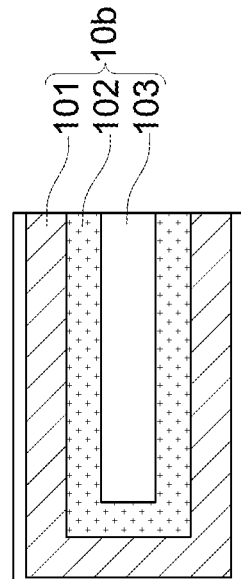
Figure 9B:
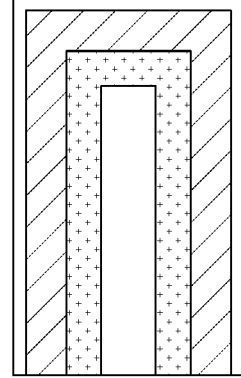

Referring to FIG. 9B, an insulation layer 11 is formed to fill the opening 10v'' of the heat pipe 10b.

Referring to FIG. 9C, the insulation layer 11 is patterned to form a plurality of openings 11o. The openings 11o are formed within the opening 10v''.

Referring to FIG. 9D, a seed layer 12 and a conductive layer 13 are formed. The seed layer 12 may be conformally formed on the surface of the insulation layer 11. The via 13v1, via 13v2 and via 13v3 of the conductive layer 13 may fill the openings 11o.

Figure 9E:
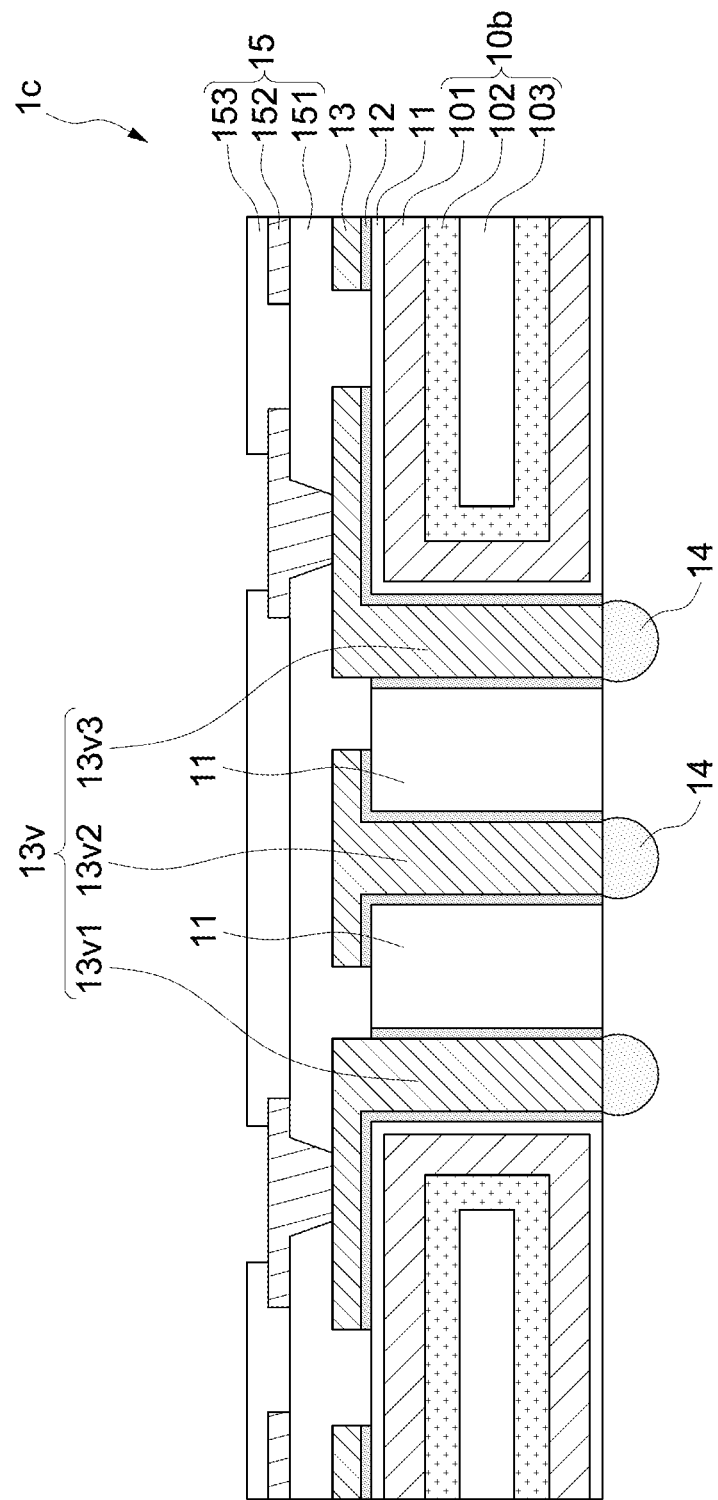

Referring to FIG. 9E, connection elements 14 and a redistribution layer 15 are formed. As a result, the substrate structure 1c is produced.

FIG. 10A, FIG. 10B, FIG. 10C and FIG. 10D illustrate various stages of an example of a method for manufacturing a substrate structure 1e according to some embodiments of the present disclosure. Further, FIG. 10A, FIG. 10B, FIG. 10C and FIG. 10D illustrate cross-sectional views along line C-C' of FIG. 4A.

Figure 10A:
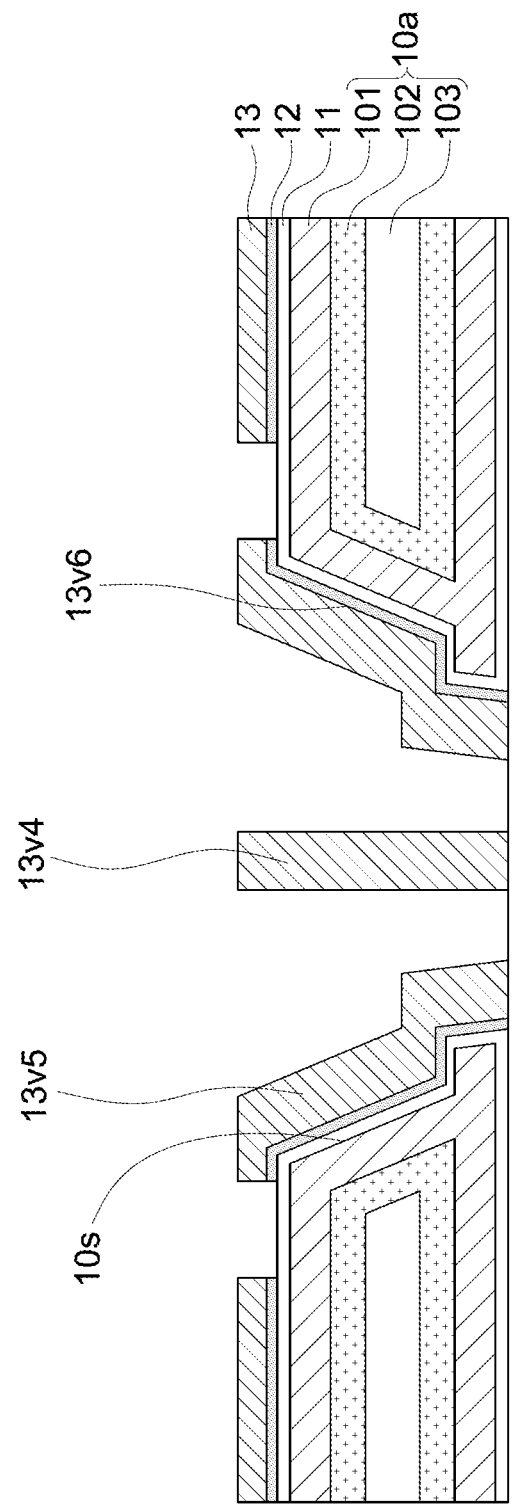
FIG. 10A, FIG. 10B, FIG. 10C and FIG. 10D illustrate various stages of an example of a method for manufacturing a substrate structure according to some embodiments of the present disclosure.

The processes which occur before the process shown in FIG. 10A may be the same as or similar to the processes shown from FIG. 8A to FIG. 8E, and are not repeated herein.

Referring to FIG. 10A, a seed layer 12 and a conductive layer 13 are formed. The seed layer 12 may be conformally formed on the insulation layer 11. In some embodiments, the via 13v4, the via 13v5 and the via 13v6 are formed on the sidewall 10s of the heat pipe 10a. In some embodiments, a conductive material may be deposited to cover the sidewall 10s of the heat pipe 10a, and then the conductive material may be patterned to form the vias 13v4, 13v5 and 13v6 that are separated from each other.

Figure 10B:
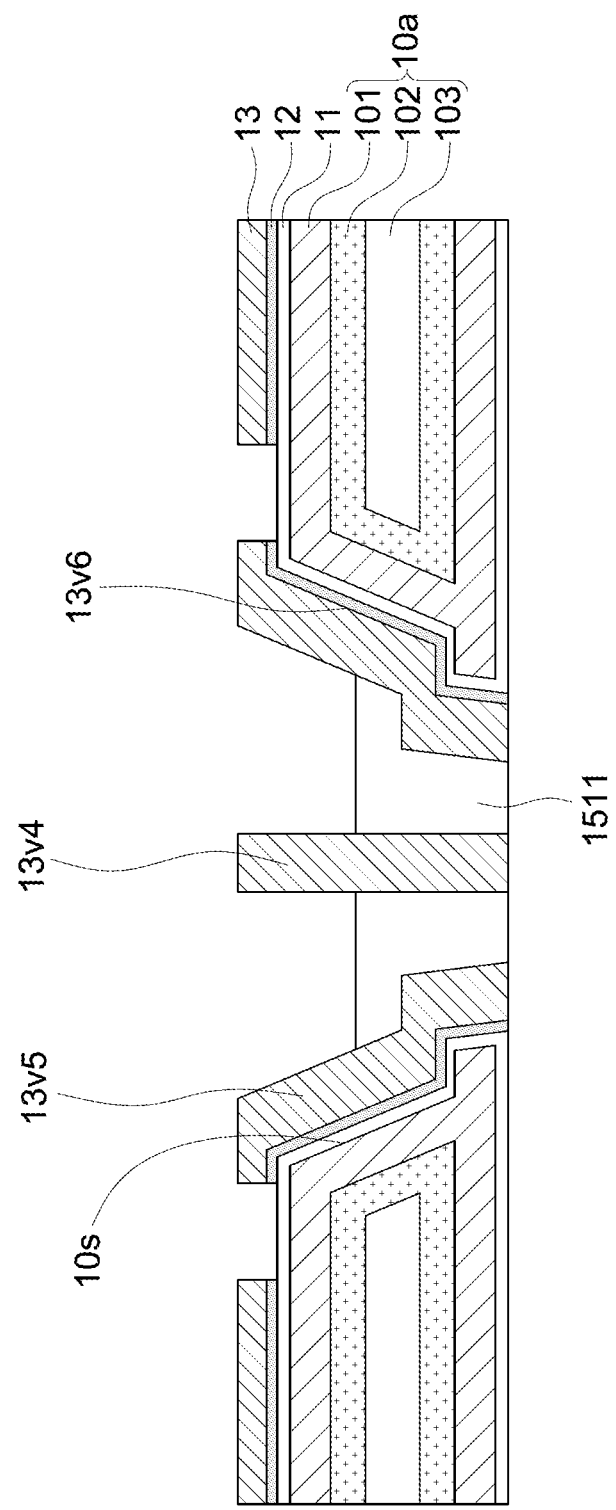

Referring to FIG. 10B, a dielectric material 1511 is formed to fill the opening 10v''' of the heat pipe 10a. The dielectric material 1511 may fill a portion of the opening 10v''', such that a lower portion of the vias 13v4, 13v5 and 13v6 is embedded within the dielectric material 1511 and an upper portion of the vias 13v4, 13v5 and 13v6 is exposed from the dielectric material 1511.

Figure 10C:
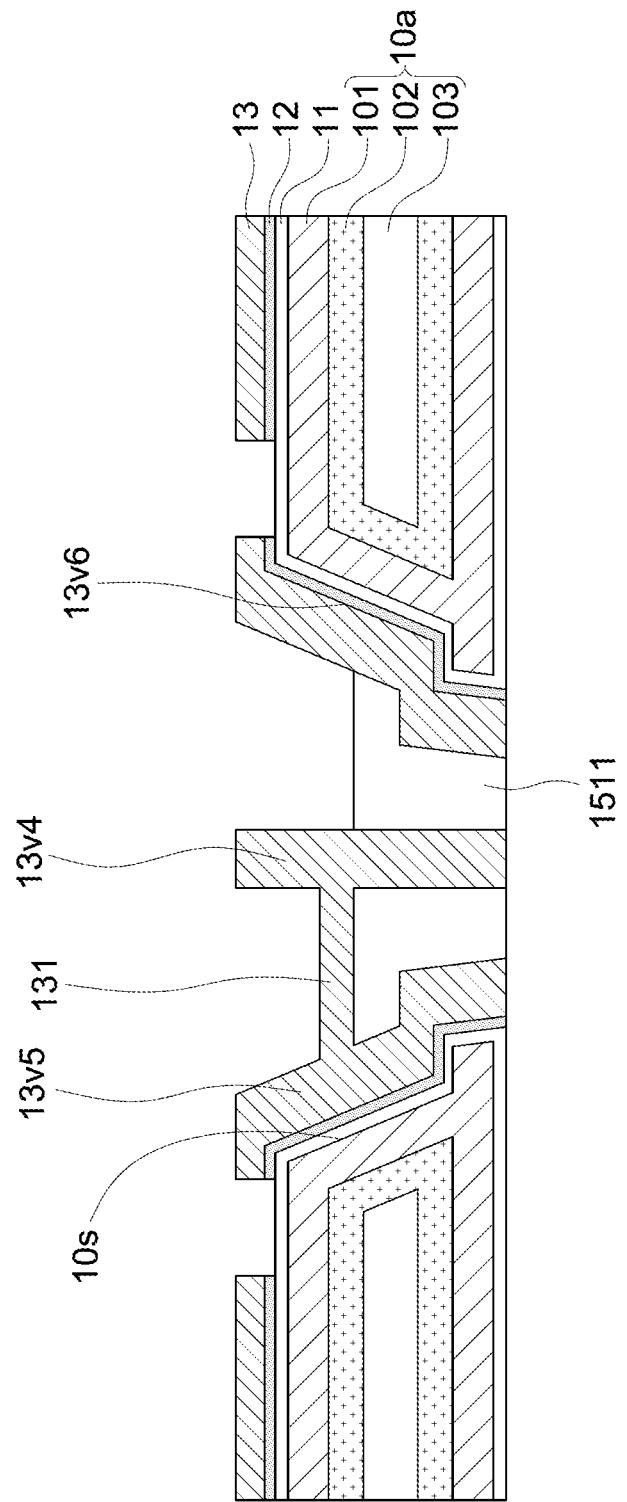

Referring to FIG. 10C, a connection structure 131 is formed to connect the via 13v4 and the via v5. The connection structure 131 may be formed on the sidewall 11s of the heat pipe 10a, and extend from the via 13v5 to the via 13v4.

Figure 10D:
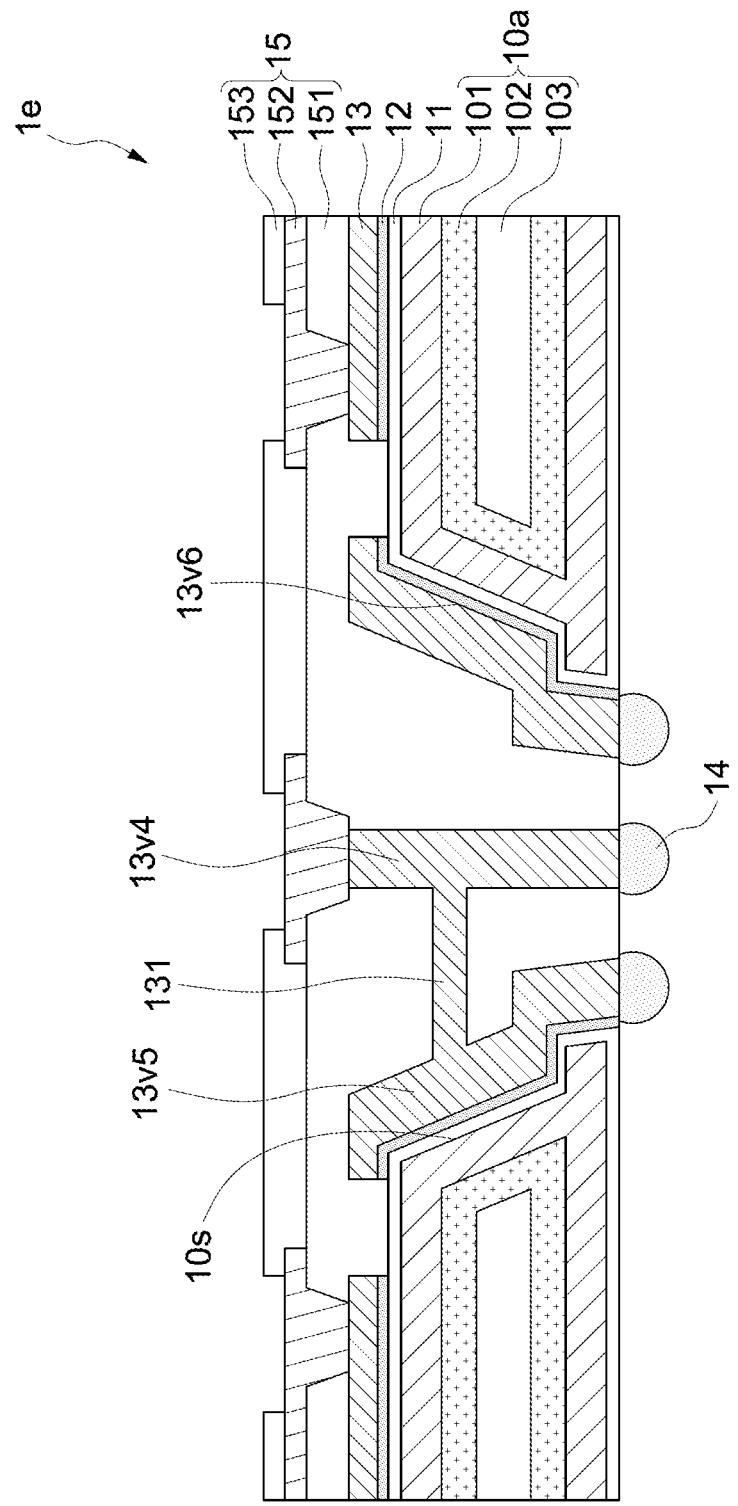

Referring to FIG. 10D, connection elements 14 and a redistribution layer 15 are formed, and thus the substrate structure 1e is produced.

Spatial descriptions, such as "above," "below," "up," "left," "right," "down," "top," "bottom view," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It should be understood that such range format is used for convenience and brevity and should be understood to flexibly include numerical values explicitly specified as limits of a range, but also to include all individual numerical values or sub-ranges encompassed within that range, as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a heat pipe having an upper surface and a lower surface, wherein the heat pipe includes an opening extending from the upper surface to the lower surface; and
   a first conductive layer disposed on the upper surface and including a via structure passing through the opening, wherein the via structure has a side surface contacting an inner surface of the opening and has a recess recessed from the side surface and adjacent to the inner surface of the opening;
   wherein the heat pipe further comprises a shell layer extending along and adjacent to the upper surface of the heat pipe, the inner surface of the opening and the lower surface of the heat pipe;
   wherein the shell layer comprises a protruded portion protruding into the recess.

2. The substrate structure of claim 1, wherein a first portion of the opening is located over the protruded portion, a second portion of the opening is located below the first portion of the opening and adjacent to the protruded portion, an aperture of the first portion of the opening is tapered along a first direction towards the lower surface of the heat pipe, and an aperture of the second portion of the opening is tapered along the first direction.

3. The substrate structure of claim 2, further comprising:
an insulation layer disposed between the heat pipe and the first conductive layer, wherein the insulation layer is disposed on the inner surface of the opening.

4. The substrate structure of claim 3, further comprising:
a seed layer disposed between the insulation layer and the first conductive layer, wherein the seed layer is formed within the opening.

5. The substrate structure of claim 4, wherein the seed layer has an edge substantially coplanar with a surface of the insulation layer.

6. The substrate structure of claim 5, wherein a lower surface of the seed layer has an elevation lower than the lower surface of the heat pipe.

7. The substrate structure of claim 6, wherein an upper surface of the protruded portion is substantially parallel to the upper surface of the heat pipe in a cross-sectional view.

8. The substrate structure of claim 7, wherein the first portion of the opening has a first angle defined by a normal direction of the upper surface of the heat pipe and the inner surface of the opening, and the second portion of the opening has a second angle defined by the normal direction of the upper surface of the heat pipe and the inner surface of the opening, and the first angle is greater than the second angle.

9. The substrate structure of claim 8, further comprising:
a dielectric layer covering the first conductive layer, and the dielectric layer has at least two openings exposing an upper surface of the first conductive layer.

* * * * *